United States Patent
Shin et al.

(10) Patent No.: US 9,761,557 B2
(45) Date of Patent: Sep. 12, 2017

(54) CMOS-MEMS INTEGRATION BY SEQUENTIAL BONDING METHOD

(71) Applicant: InvenSense, Inc., San Jose, CA (US)

(72) Inventors: Jong Il Shin, San Jose, CA (US); Peter Smeys, San Jose, CA (US); Jongwoo Shin, Pleasanton, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/696,994

(22) Filed: Apr. 27, 2015

(65) Prior Publication Data

US 2015/0311178 A1 Oct. 29, 2015

Related U.S. Application Data

(63) Continuation-in-part of application No. 14/453,431, filed on Aug. 16, 2014.
(Continued)

(51) Int. Cl.
*H01L 23/00* (2006.01)
*B81C 1/00* (2006.01)

(52) U.S. Cl.
CPC .......... *H01L 24/83* (2013.01); *B81C 1/00238* (2013.01); *B81B 2207/012* (2013.01);
(Continued)

(58) Field of Classification Search
CPC .......... H01L 24/83; H01L 2224/83805; H01L 2224/83065; H01L 2224/83951;
(Continued)

(56) References Cited

U.S. PATENT DOCUMENTS 8,564,076 B1 10/2013 Huang et al.
2005/0170656 A1* 8/2005 Nasiri ................ B81C 1/00238
438/700
(Continued)

FOREIGN PATENT DOCUMENTS

CN 102214586 10/2011
CN 102867774 1/2013
DE 102010036217 A1 3/2012

OTHER PUBLICATIONS

Korean Office Action in Application No. 10-2015-0068898 dated Oct. 28, 2016 (4 pages).
(Continued)

*Primary Examiner* — Latanya N Crawford
(74) *Attorney, Agent, or Firm* — Amin, Turocy & Watson, LLP (57) ABSTRACT

Methods for bonding two wafers are disclosed. In one aspect, a first wafer includes an integrated circuit and the second wafer including a MEMS device. The method comprises depositing a bond pad on a metal on the first wafer and sequentially bonding the first wafer to the second wafer utilizing first and second temperatures. The second wafer is bonded to the bond pad at the first temperature and the bond pad and the metal are bonded at the second temperature. In another aspect, a first wafer including an integrated circuit, the second wafer includes a MEMS device. The method comprises depositing a bond pad on a metal on one of the first wafer and the second wafer and bonding the first wafer to the second wafer at a first temperature via a direct bond interface. The method includes bonding the bond pad to the metal at a second temperature.

16 Claims, 9 Drawing Sheets

Related U.S. Application Data (60) Provisional application No. 61/985,340, filed on Apr. 28, 2014.

(52) U.S. Cl.
CPC .. *B81C 2203/019* (2013.01); *B81C 2203/035* (2013.01); *B81C 2203/0792* (2013.01); *H01L 2224/83065* (2013.01); *H01L 2224/83805* (2013.01); *H01L 2224/83951* (2013.01)

(58) Field of Classification Search
CPC .......... B81C 1/00238; B81C 2203/035; B81C 2203/019; B81C 2203/0792; B81B 2207/012
See application file for complete search history.

(56) References Cited

U.S. PATENT DOCUMENTS

| | | | |
|---|---|---|---|
| 2006/0208326 A1* | 9/2006 | Nasiri | B81C 1/00238 257/414 |
| 2006/0249797 A1 | 11/2006 | Nakazawa et al. | |
| 2010/0230776 A1 | 9/2010 | Gogoi | |
| 2011/0048132 A1* | 3/2011 | Rettig | B81B 7/0041 73/514.16 |
| 2012/0104589 A1 | 5/2012 | Kant et al. | |
| 2012/0236383 A1 | 9/2012 | Mizoguchi | |
| 2012/0236883 A1 | 9/2012 | Adler | |
| 2012/0264249 A1 | 10/2012 | Kundalgurki et al. | |
| 2014/0191341 A1* | 7/2014 | Chu | B81B 7/0038 257/415 |
| 2014/0235032 A1* | 8/2014 | Akiyama | H01L 21/76251 438/458 |

OTHER PUBLICATIONS

Chinese Office Action in Application No. 2015102511307 dated May 5, 2016 (5 pages).
Int'l Preliminary Report on Patentability for Appln. No. PCT/US2015/027946 dated Nov. 1, 2016 (8 pages).
Chinese Office Action in Application No. 2015102511307 dated Jan. 16, 2017 (5 pages).

* cited by examiner

CMOS-MEMS INTEGRATION BY SEQUENTIAL BONDING METHOD

CROSS-REFERENCE TO RELATED APPLICATION

This application claims benefit under 35 USC 119(e) of U.S. Provisional Patent Application No. 61/985,340, filed on Apr. 28, 2014, entitled "CMOS-MEMS INTEGRATION BY SEQUENTIAL BONDING METHOD," and is a continuation-in-part of U.S. patent application Ser. No. 14/453,431, filed Aug. 6, 2014, entitled "METHOD TO IMPROVE SURFACE ROUGHNESS AND ELIMINATE SHARP CORNERS ON AN ACTUATOR LAYER OF A MEMS DEVICE," both of which are incorporated herein by reference in their entireties.

FIELD OF THE INVENTION

The present invention relates generally to the fabrication of MEMS (Microelectromechanical systems) devices and more particularly a method and system for bonding first and second substrates.

BACKGROUND

A method of bonding germanium to aluminum between CMOS and MEMS to create a robust electrical and mechanical contact has been adapted. However, having germanium deposited and patterned on MEMS device, excessive shelf time of MEMS device wafer with germanium pad can result in poor Al—Ge bond quality collecting moisture from ambient environment and native oxide formation. In addition, germanium material properties can be a limiting factor for a new process inserted between Ge pad and CMOS-MEMS bonding process. Accordingly, what is needed is a method and system to address the above identified issues. The present invention addresses such a need.

SUMMARY

Methods for bonding a first wafer and a second wafer are disclosed. In a first aspect, a first wafer includes an integrated circuit and the second wafer including a MEMS device. The method comprises depositing a bond pad on a metal on the first wafer and sequentially bonding the first wafer to the second wafer utilizing first and second temperatures. The second wafer is bonded to the bond pad at the first temperature and the bond pad and the metal are bonded at the second temperature.

In a second aspect, first wafer including an integrated circuit, the second wafer includes a MEMS device. The method comprises depositing a bond pad on a metal on one of the first wafer and the second wafer and bonding the first wafer to the second wafer at a first temperature via a direct bond interface. The method includes bonding the bond pad to the metal at a second temperature.

DETAILED DESCRIPTION

The present invention relates generally to the fabrication of MEMS (Microelectromechanical systems) devices and more particularly a method and system for bonding first and second substrates. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

In the described embodiments micro-electro-mechanical systems (MEMS) refers to a class of structures or devices fabricated using semiconductor-like processes and exhibiting mechanical characteristics such as the ability to move or deform. In the described embodiments, the MEMS device may refer to a semiconductor device implemented as a micro-electro-mechanical system. The MEMS structure may refer to any feature that may be part of a larger MEMS device. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

A structural layer may refer to the silicon layer with moveable structures. An engineered silicon-on-insulator (ESOI) wafer may refer to an SOI wafer with cavities beneath the silicon structural layer. A cap wafer typically refers to a thicker substrate used as a carrier for the thinner silicon device substrate in a silicon-on-insulator wafer.

A MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. A cap or a cover provides mechanical protection to the structural layer and optionally forms a portion of the enclosure. Standoff defines the vertical clearance between the structural layer and the IC substrate.

Standoff may also provide electrical contact between the structural layer and the IC substrate. Standoff may also provide a seal that defines an enclosure. Integrated Circuit (IC) substrate may refer to a silicon substrate with electrical circuits, typically CMOS circuits. A cavity may refer to a recess in a substrate. Chip includes at least one substrate typically formed from a semiconductor material. A single chip may be formed from multiple substrates, where the substrates are mechanically bonded together. Multiple chip includes at least two substrates, wherein the two substrates are electrically connected, but do not require mechanical bonding.

A method of bonding germanium to aluminum between a CMOS substrate and a MEMS substrate to create a robust electrical and mechanical contact is described for example in U.S. Pat. No. 7,442,570, issued Oct. 28, 2008, entitled "METHOD OF FABRICATION OF Al/GE BONDING IN A WAFER PACKAGING ENVIRONMENT AND A PRODUCT PRODUCED THEREFROM," which is assigned to the assignee of this application and incorporated by reference in its entirety herein. Although this process is effective in many environments sometimes when depositing and patterning germanium Ge on the MEMS substrate, excessive shelf time of MEMS substrate with the Ge pad can result in poor Al—Ge bond quality collecting moisture from ambient environment and native oxide formation. In addition, germanium material properties can be a limiting factor for a new process inserted between Ge pad and CMOS-MEMS bonding process.

For these reasons, patterning germanium pad over top metal has been selected as a part of CMOS process flow, and CMOS-MEMS bonding processes were altered to bond MEMS Si directly to Ge pad pattered on bond pad of CMOS.

Figure 1A:
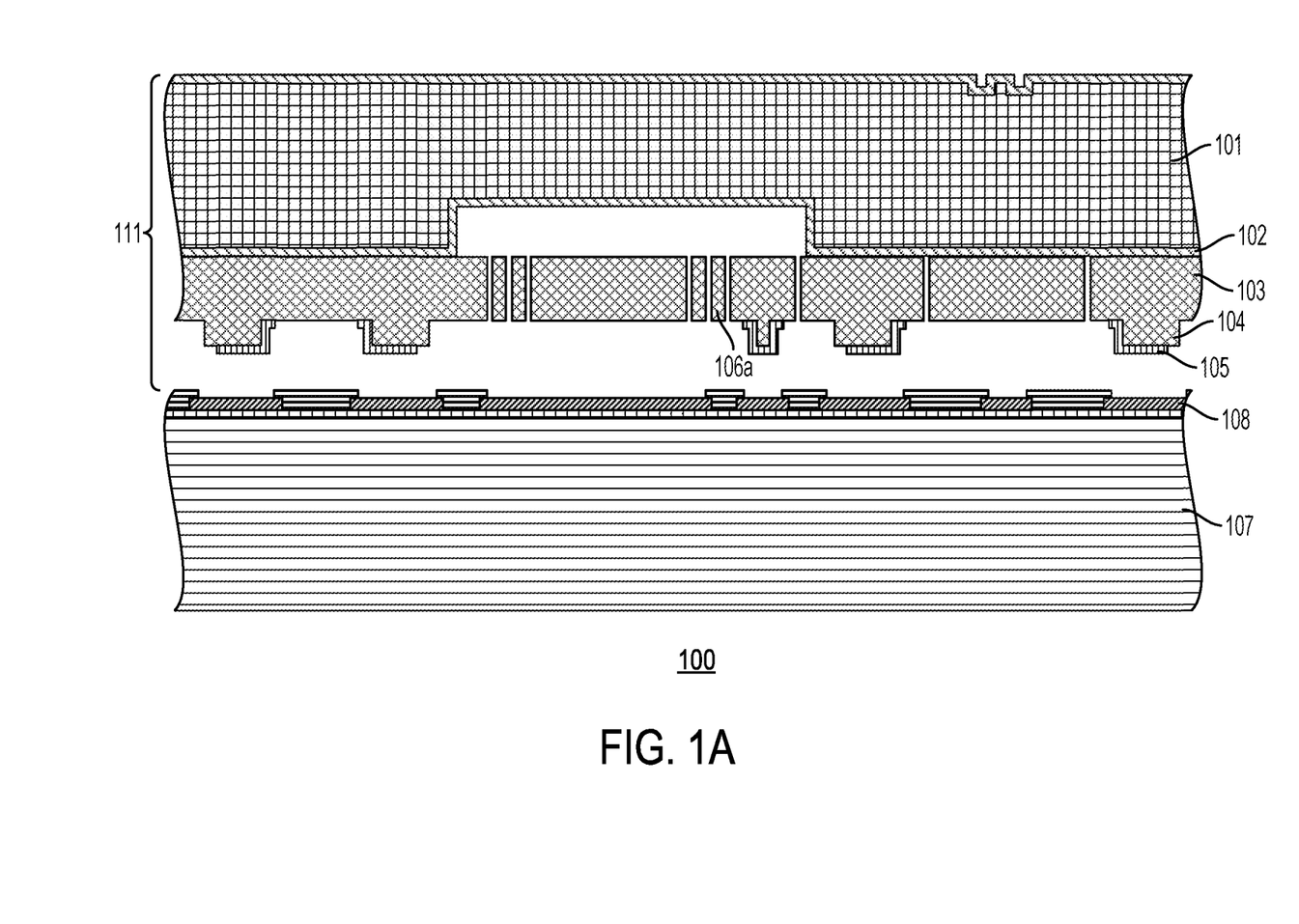
FIGS. 1A and 1B are diagrams related to a conventional process for bonding a CMOS-MEMS integrated sensor.
Figure 1B:
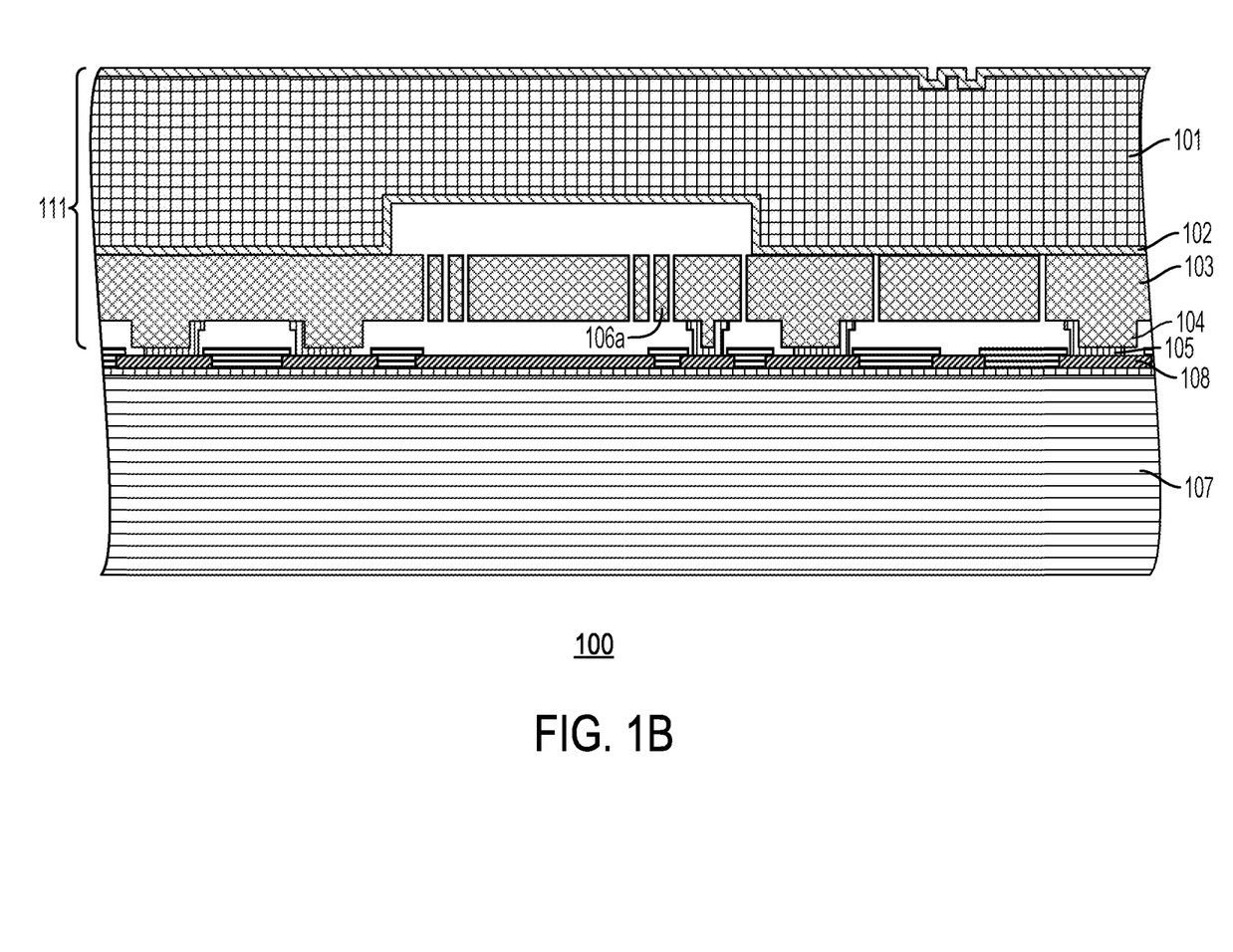

FIGS. 1A and 1B are diagrams related to a process for bonding a CMOS-MEMS integrated sensor 100. The CMOS-MEMS integrated sensor 100 includes a MEMS substrate 111 and CMOS substrate 107. The MEMS substrate 111 includes a handle layer 101 with cavities etched into it and a device layer 103, bonded together with a thin dielectric film 102 (such as silicon oxide) in between. In some embodiments, the device layer 103 is made of single crystal silicon or poly crystal silicon. Standoff 104 is formed with a germanium (Ge) pad 105 on top of the standoff 104. The MEMS substrate 111 is completed after the device layer 103 is patterned and etched to form movable structure 106a.

The MEMS integrated sensor 100 includes a CMOS substrate 107. A layer of conductive material 108, for example aluminum, is deposited on the CMOS substrate 107 to provide electrical connection from the device layer 103 to the CMOS substrate 107. In an embodiment, the CMOS substrate-MEMS integration is achieved by eutectic bonding of Ge pad 105 on the MEMS substrate 111 with the aluminum layer 108 of the CMOS substrate 107. In an embodiment, the MEMS substrate 111 and the CMOS substrate 107 are bonded to form the MEMS integrated sensor 100.

Starting from Engineering SOI wafer as in FIGS. 1A, the standoff 104 is formed by DRIE to define a small protrusion on the MEMS wafer. It defines the distance (gap) between the device layer 103 and the Ge pad 105 and also the areas where Al—Ge eutectic bonding electrically connects the device layer 103 to CMOS metal pads. A hermetic seal ring which defines the MEMS cavity is also defined by patterning of standoff 104 in a seal ring shape. The Ge pad 105 is deposited and patterned for later eutectic bond with the aluminum layer 108 on the CMOS substrate 107. A DRIE will pattern the actuator and release the MEMS structure.

Since Ge pad 105 has a limited shelf life when factoring in native oxide formation, CMOS-MEMS bonding should be performed within this shelf time restriction in order to guarantee a good quality bond. It is impossible to rework a Ge pad 105 once the actuator is patterned by a deep ion reactive etch (DRIE), and any wafer with the Ge pad 105 exceeding Ge shelf life staged after DRIE will end up being scrapped. Furthermore, any process step insertion at MEMS device can also be limited by Ge material property. Accordingly what is needed is a system and method to address this issue.

Figure 2:
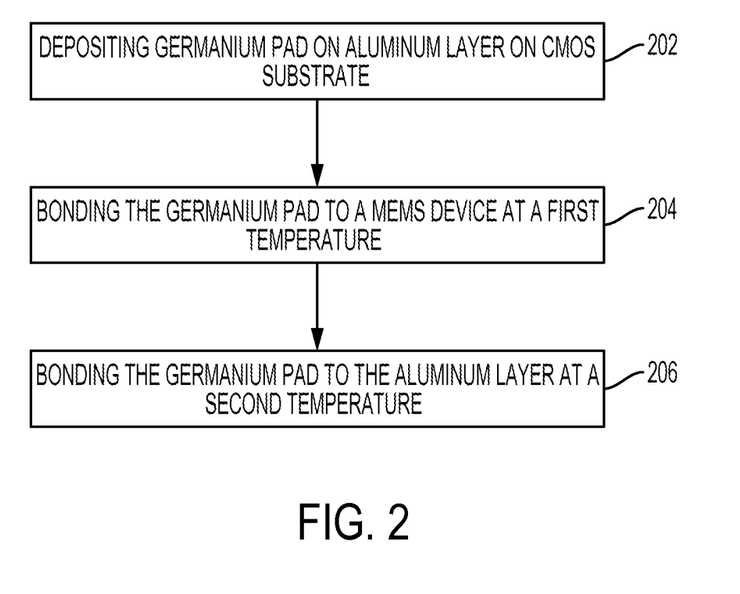
FIG. 2 is a flow chart of a first process for bonding a CMOS-MEMS integrated sensor in accordance with the present invention.
Figure 3A:
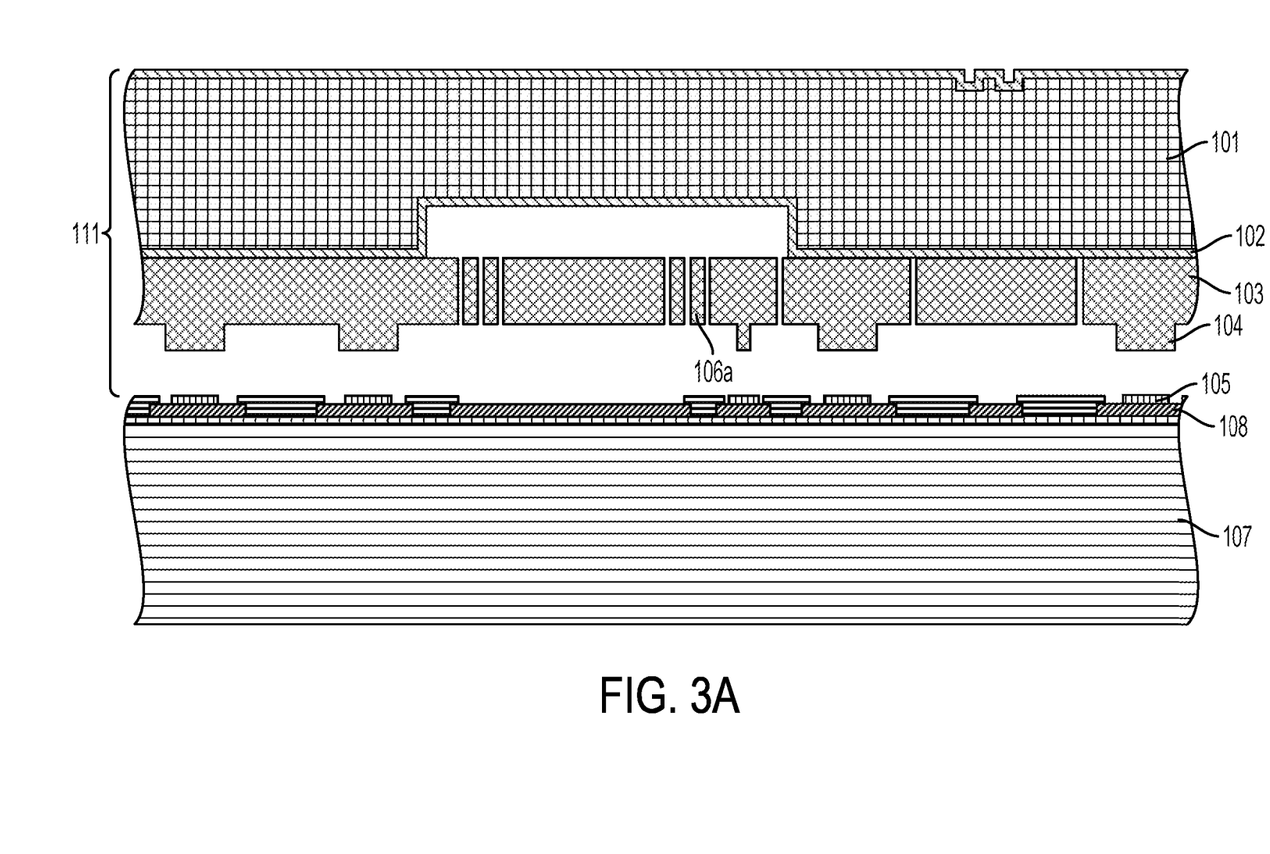
FIGS. 3A and 3B illustrate diagrams related to the process shown in FIG. 2.
Figure 3B:
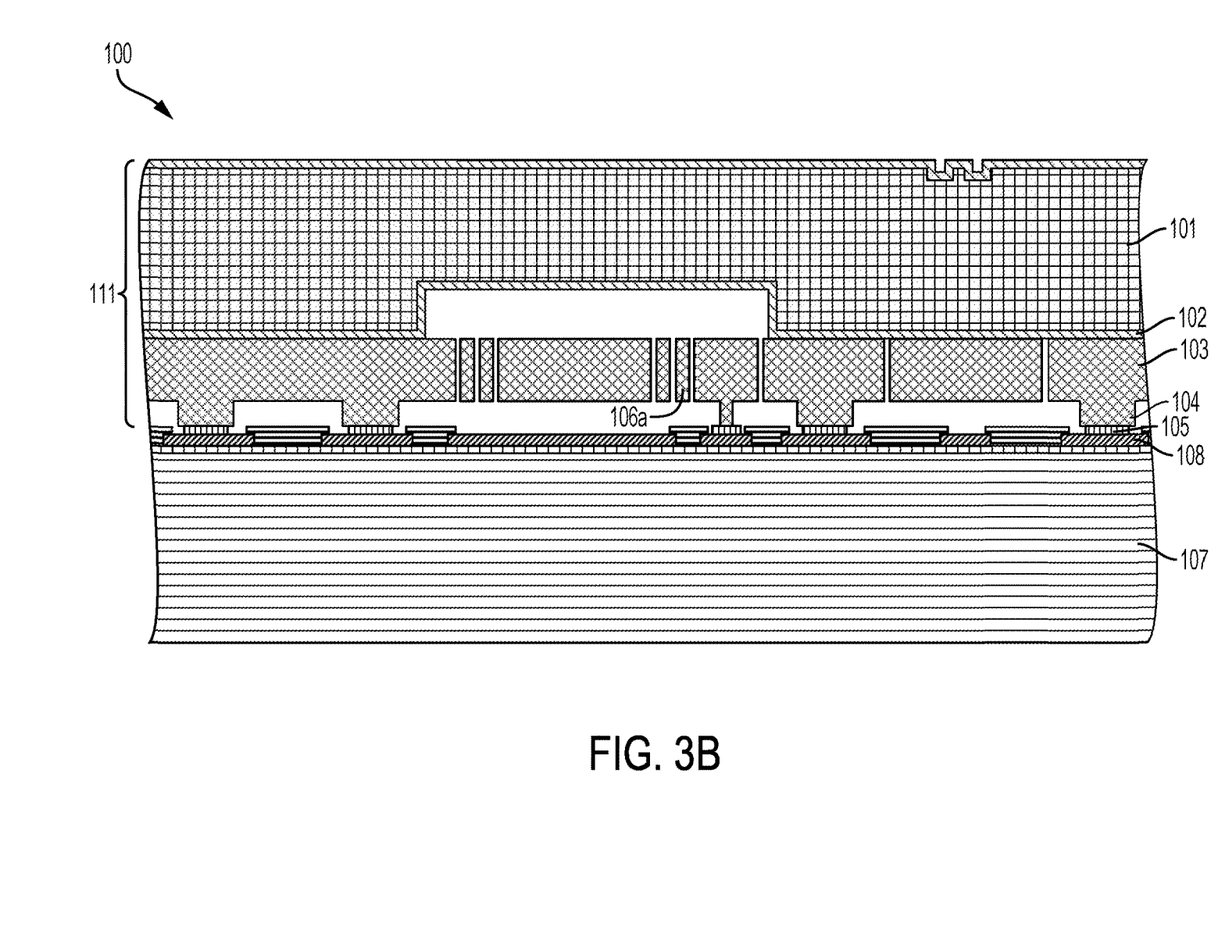

FIG. 2 is a flow chart of a process for bonding a CMOS-MEMS integrated sensor in accordance with the present invention. FIGS. 3A and 3B illustrate diagrams related to the process shown in FIG. 2. Referring to FIGS. 2, 3A and 3B together, in a process in accordance with an embodiment, a Ge pad 105 is deposited on an aluminum layer 108 on the CMOS substrate 107, via step 202.

Next, the Ge pad 105 is bonded to a MEMS substrate 111 at a first temperature, via step 204. In an embodiment as is shown in FIG. 3A, a standoff 104 of the device layer 103 of the MEMS substrate 111 is bonded to the Ge pad 105 to form a silicide bond. Typically a temperature range of the first temperature is between 200-300° C. Furthermore, typically the first temperature is provided for a predetermined time period, for example between 1 and 2 hours under a predetermined pressure. Some surface treatments of the Ge pad 105 may be required prior to the bonding step to remove contaminants.

Thereafter, the Ge pad 105 is bonded to the aluminum layer 108 at a second temperature, via step 206. Typically a temperature range of the second temperature is between 400-450° C. As is seen, the first temperature is less than the second temperature. In an embodiment, the CMOS-MEMS integration is achieved by eutectic bonding of Ge pad 105 with the aluminum layer 108 of the CMOS substrate 107.

Figure 4:
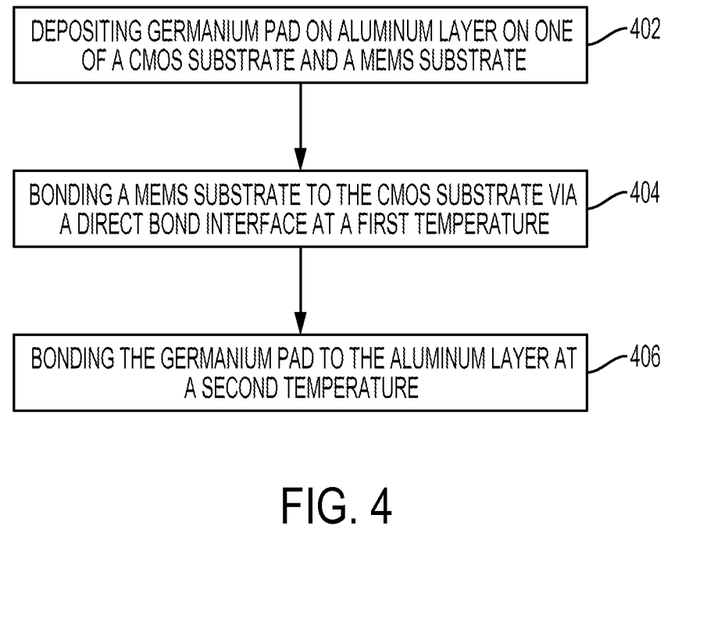
FIG. 4 is a flow chart of a second process for bonding a CMOS-MEMS integrated sensor in accordance with the present invention.
Figure 5A:
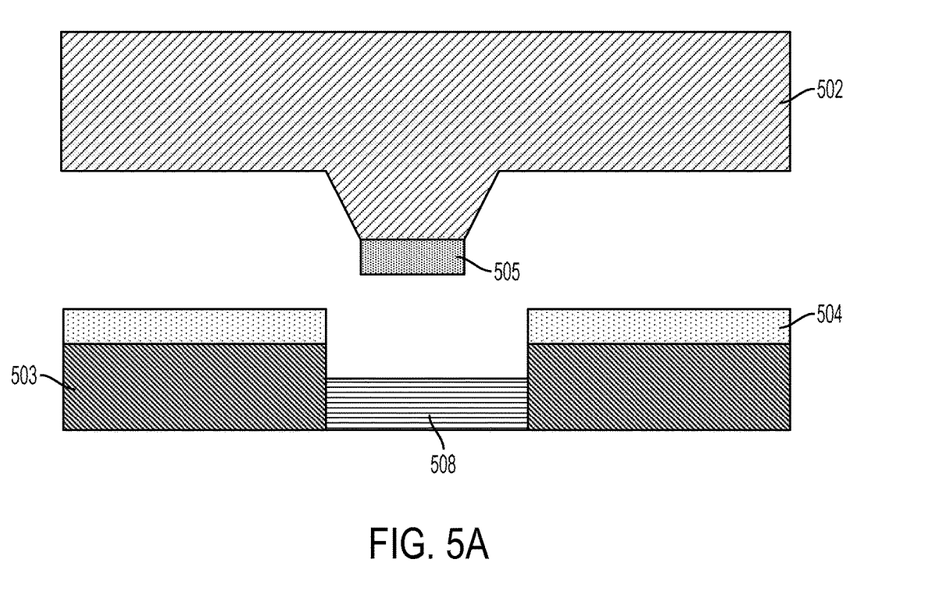
FIGS. 5A and 5B illustrate diagrams related to the process shown in FIG. 4.
Figure 5B:
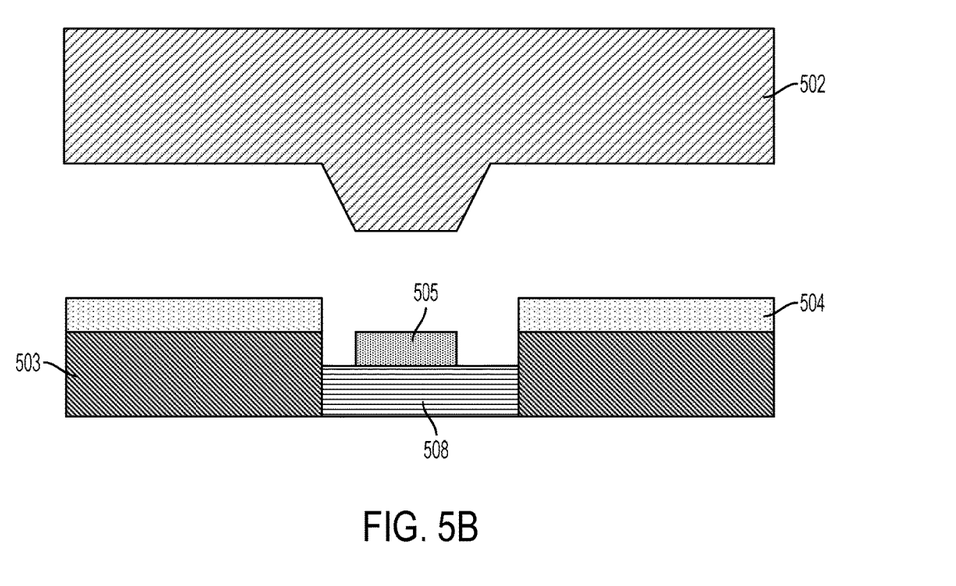

FIG. 4 is a flow chart of a second process for bonding a CMOS-MEMS integrated sensor in accordance with the present invention. FIGS. 5A and 5B illustrate diagrams related to the process shown in FIG. 4. Referring to FIGS. 4, 5A and 5B together, in a process in accordance with an embodiment, a Ge pad 505 is deposited on either the MEMS silicon substrate 502 (FIG. 5A) or on a top level aluminum layer 508 (FIG. 5B) on the CMOS substrate 503, via step 402. In both FIGS. 5A and 5B, a direct bond interface material 504 is provided on the CMOS substrate 503. In an embodiment, the direct bond interface material 504 comprises any of an oxide, Cobalt (Co) or nickel (Ni) material. In embodiments in accordance with both FIGS. 5A and 5B, a bond is made between the MEMS silicon substrate 502 and the direct bond interface material 504 at a low temperature (i.e. below 300° C.), via step 404 and thereafter the second bond can be formed between the Ge pad 505 and the top level aluminum layer 508 at a second temperature level (i.e. above 400° C.), via step 406.

In the embodiment of FIG. 5B, there is an additional feature that can optionally be provided to improve the process. A high temperature anneal can be provided to the MEMS silicon substrate 502 prior to the low temperature bond to further improve the shelf life of the integrated device. For example, in U.S. patent application Ser. No. 14/453,431, filed Aug. 6, 2014, entitled "METHOD TO IMPROVE SURFACE ROUGHNESS AND ELIMINATE SHARP CORNERS ON AN ACTUATOR LAYER OF A MEMS DEVICE," which is assigned to the assignee of this application and incorporated by reference in its entirety herein, it has been disclosed that a subsequent high temperature anneal will provide smooth surfaces and rounded corners for the device layer 503. What is meant by a high temperature anneal in the context of a hydrogen environment is a temperature of 1000° C. or greater.

Figure 6:
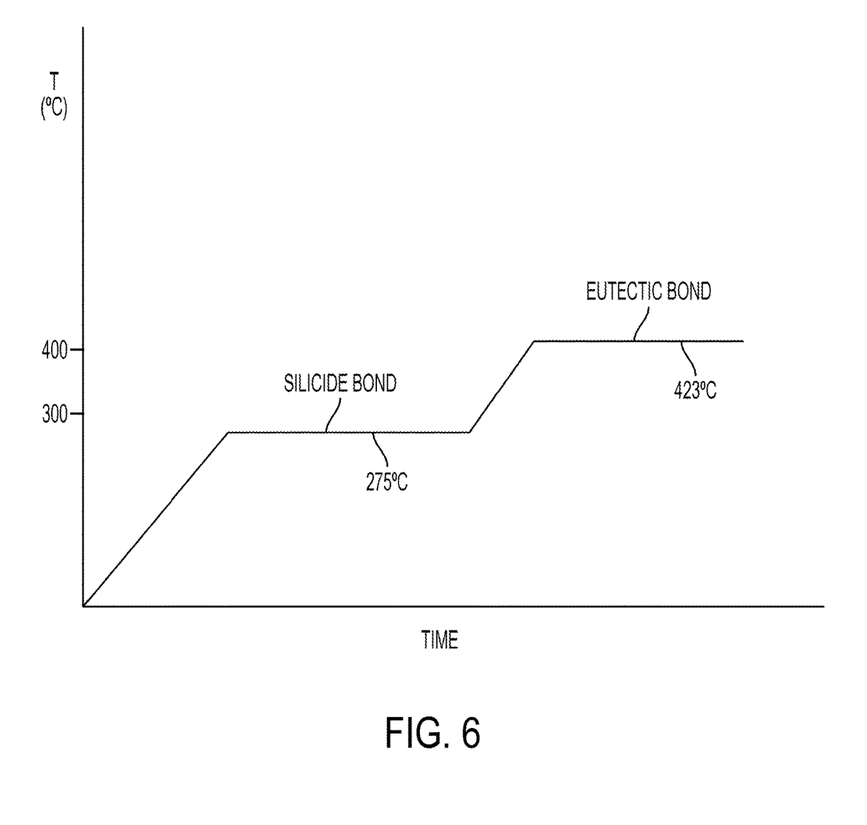
FIG. 6 illustrates an exemplary bonding profile to achieve a MEMS silicide bond at a first temperature and a eutectic bond at a second temperature.

FIG. 6 illustrates an exemplary bonding profile to achieve a MEMS silicide bond at a first temperature and a eutectic bond at a second temperature utilizing any of the above identified process. As is seen, the temperature is elevated to for example 275° C. for a first predetermined time period to provide the silicide bond between the handle layer of the MEMS substrate and the Ge pad. Thereafter a eutectic bond is formed between the Ge pad and the aluminum layer by elevating the temperature to 423° C.

A method and structure of bonding of germanium to aluminum between two substrates to create a robust electrical and mechanical contact is disclosed. An aluminum-germanium bond has the following unique combination of attributes: (1) it can form a hermetic seal; (2) it can be used to create an electrically conductive path between two substrates; (3) it can be patterned so that this conduction path is localized; (4) the bond can be made with the aluminum that is available as a standard foundry CMOS process. This has the significant advantage of allowing for wafer-level bonding or packaging without the addition of any additional process layers to the CMOS wafer.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A method for bonding a first wafer and a second wafer, comprising:
   depositing a bond pad on a metal on the first wafer, the first surface of the bond pad in contact with the metal, the first wafer including an integrated circuit, and the second wafer including a MEMS device, wherein the bond pad comprises a germanium bond pad and the metal comprises aluminum;
   positioning the second wafer in direct contact with a second surface of the bond pad opposite the first surface; and
   sequentially bonding the first wafer to the second wafer utilizing first and second temperatures, wherein the second wafer is bonded to the bond pad at the first temperature and wherein the bond pad and the metal are bonded at the second temperature, wherein the bond between the germanium bond pad and the aluminum comprises a eutectic bond, and wherein a high temperature appealing of the second wafer is provided in a hydrogen environment before the second bonding step.

2. The method of claim 1, wherein the sequential bonding step comprises:
   bonding the bond pad and the second wafer at a temperature not to exceed 300° C.; and
   bonding the bond pad and the metal to form a eutectic bond at a temperature greater than 420° C.

3. The method of claim 1, wherein the first temperature is less than the second temperature.

4. The method of claim 1, wherein the first temperature is less than 400° C. and the second temperature is greater than 400° C.

5. The method of claim 1, wherein the eutectic bond provides a hermetic seal.

6. The method of claim 1, wherein the second wafer includes a device layer and a handle layer.

7. The method of claim 6, wherein the handle layer includes at least one standoff formed thereon.

8. The method of claim 7, wherein at least one standoff is bonded to the bond pad via bonding the bond pad and the second wafer.

9. The method of claim 1, wherein the second wafer comprise an engineered silicon-on-insulator (ESOI).

10. A method for bonding a first wafer and a second wafer, comprising:
    depositing a bond pad on a metal on one of the first wafer and the second wafer, the first wafer including an integrated circuit, the second wafer including a MEMS device, wherein the bond pad comprises a germanium bond pad and the metal comprises aluminum;
    bonding the first wafer to the second wafer at a first temperature via a direct bond interface; and
    bonding the bond pad to the metal at a second temperature, wherein the bond between the germanium bond pad and the aluminum comprises a eutectic bond, and wherein a high temperature annealing of the second wafer is provided in a hydrogen environment before the second bonding step.

11. The method of claim 10, wherein the first temperature is less than the second temperature.

12. The method of claim 10, wherein the first temperature is less than 400° C. and the second temperature is greater than 400° C.

13. The method of claim 10, wherein the eutectic bond provides a hermetic seal.

14. The method of claim 10, wherein bonding to the direct bond interface requires surface treatment before bonding.

15. The method of claim 10, wherein an electrical connection is provided through the bonding the bond pad to the metal step.

16. The method of claim 10, wherein the bond pad is etched before bond pad formation.

* * * * *